United States Patent
Foote, Jr.

(10) Patent No.: US 7,863,153 B1
(45) Date of Patent: Jan. 4, 2011

(54) SYSTEM AND METHOD FOR CREATING DIFFERENT FIELD OXIDE PROFILES IN A LOCOS PROCESS

(75) Inventor: Richard W. Foote, Jr., Kennedale, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 663 days.

(21) Appl. No.: 11/486,987

(22) Filed: Jul. 13, 2006

(51) Int. Cl.
*H01L 21/76* (2006.01)

(52) U.S. Cl. .................. 438/452; 438/297; 438/362; 438/981; 257/E21.559

(58) Field of Classification Search .............. 438/225, 438/297, 362, 439, 452, 981; 257/509, E21.552, 257/E21.555, E21.559
See application file for complete search history.

(56) References Cited

U.S. PATENT DOCUMENTS

| | | | |
|---|---|---|---|
| 5,110,756 A * | 5/1992 | Gregor et al. ............... | 438/449 |
| 5,116,778 A | 5/1992 | Haskell et al. | |
| 5,116,779 A | 5/1992 | Iguchi | |
| 5,128,274 A * | 7/1992 | Yabu et al. ................. | 438/452 |
| 5,148,257 A | 9/1992 | Kishi | |
| 5,344,785 A | 9/1994 | Jerome et al. | |
| 5,369,052 A * | 11/1994 | Kenkare et al. ............ | 438/439 |
| 5,464,790 A | 11/1995 | Hawley | |
| 5,538,917 A * | 7/1996 | Kunitou ....................... | 438/443 |
| 5,614,421 A * | 3/1997 | Yang ........................... | 438/440 |
| 5,782,622 A * | 7/1998 | Ozu et al. ..................... | 418/63 |
| 5,911,109 A | 6/1999 | Razouk et al. | |
| 6,163,047 A | 12/2000 | Sung et al. | |
| 6,355,532 B1 | 3/2002 | Seliskar et al. | |
| 6,511,887 B1 | 1/2003 | Yu et al. | |
| 6,921,932 B1 | 7/2005 | Yu et al. | |
| 7,153,776 B2 | 12/2006 | Chen et al. | |

OTHER PUBLICATIONS

Gian Gerosa et al., "A High Performance CMOS Technology for 256/1MB EPROMs", 1985 IEEE, pp. 631-634.

Charles A. Dark, "System and Method for Providing a Nitride Cap Over a Polysilicon Filled Trench to Prevent Formation of a Vertical Bird's Beak Structure in the Manufacture of a Semiconductor Device", U.S. Appl. No. 11/201,926 filed Aug. 11, 2005.

* cited by examiner

*Primary Examiner*—Mary Wilczewski
*Assistant Examiner*—Toniae M Thomas

(57) ABSTRACT

An efficient method is disclosed for creating different field oxide profiles in a local oxidation of silicon process (LOCOS process). The method comprises (1) forming a first portion of the field oxide with a first field oxide profile (e.g., an abrupt bird's beak profile) during a field oxide oxidation process, and (2) forming a second portion of the field oxide with a second field oxide profile (e.g., a graded bird's beak profile) during the field oxide oxidation process. A graded bird's beak profile enables higher breakdown voltages. An abrupt bird's beak profile enables higher packing densities. The method gives an integrated circuit designer the flexibility to create an appropriate field oxide profile at a desired location.

20 Claims, 3 Drawing Sheets

US 7,863,153 B1

SYSTEM AND METHOD FOR CREATING DIFFERENT FIELD OXIDE PROFILES IN A LOCOS PROCESS

CROSS-REFERENCE TO RELATED APPLICATION

The patent application is related to U.S. Patent Application Ser. No. 11/486,952 entitled "System and Method for Increasing Breakdown Voltage of LOCOS Isolated Devices" that is being filed concurrently with this patent application. This patent application and U.S. Patent Application Ser. No. 11/486,952 are both owned by the same assignee.

TECHNICAL FIELD OF THE INVENTION

The present invention is generally directed to semiconductor technology and, in particular, to a system and method for creating different field oxide profiles in a local oxidation of silicon process (LOCOS process).

BACKGROUND OF THE INVENTION

In recent years, there have been great advancements in the speed, power, and complexity of integrated circuits. Large scale integrated circuits comprise thousands of devices placed on a single integrated circuit chip. A standard process for electrically isolating the devices on an integrated circuit chip is the local oxidation of silicon process (LOCOS process).

The creation of a prior art LOCOS isolation structure is illustrated in FIG. 1 and in FIG. 2. The structure 100 shown in FIG. 1 comprises a silicon substrate 100. A layer of pad oxide 120 made up of silicon dioxide ($SiO_2$) is placed on the silicon substrate 100. Then a layer 130 of silicon nitride ($Si_3N_4$) is placed on the layer pad oxide 120. A mask and etch procedure is used to etch an aperture 140 through the silicon nitride layer 130 and through the pad oxide layer 120 down to the silicon substrate 100. The application of the mask and etch procedure creates the structure 100 shown in FIG. 1.

Then the portions of the silicon substrate 100 that are exposed through aperture 140 are exposed to steam ($H_2$, $O_2$) at a relatively high temperature (e.g., one thousand degrees Celsius (1000° C.)). The oxygen in the steam oxidizes the silicon substrate 100 to form silicon dioxide ($SiO_2$). The oxidation process causes the oxidized portion of the silicon substrate 100 increase in size.

The resulting structure 200 is shown in FIG. 2. The oxidized portion of the silicon substrate 100 is designated with reference numeral 210. As shown in FIG. 2, the oxidized portion 210 of the silicon substrate 100 is sometimes referred to as a field oxide. The field oxide 210 forms an isolation structure or isolation barrier that electrically separates and isolates portions of the integrated circuit chip.

At the edges of the field oxide 210 (near the edges of the silicon nitride portions 130) the thickness of the field oxide tapers off. The maximum thickness of the field oxide 210 (shown by double arrows in FIG. 2) gradually decreases near edges of the field oxide 210 and tapers down to the thickness of the pad oxide 120.

The tapering profile of the edges of the field oxide 210 forms a portion of the field oxide 210 that is known as a "bird's beak." The bird's beak portion of the field oxide 210 in FIG. 2 is designated with reference numeral 220.

If the bird's peak portion of the field oxide has a relatively graded slow tapering profile the resulting bird's beak profile will have the bird's peak profile 300 shown in FIG. 3. For convenience in description the bird's beak profile 300 will be referred to as a "graded" bird's beak.

If the bird's beak portion of the field oxide has a relatively short quick tapering profile the resulting bird's beak profile will have the bird's beak profile 400 shown in FIG. 4. For convenience in description the bird's beak profile 400 will be referred to as an "abrupt" bird's beak.

In prior art manufacturing processes a thick pad oxide and/or a thin silicon nitride layer will create a graded bird's beak 300. Similarly, in prior art manufacturing processes a thin pad oxide and/or a thick silicon nitride layer will create an abrupt bird's beak 400.

A significant advantage of the abrupt bird's beak is that the abrupt bird's beak takes up less lateral space than a graded bird's beak. This means that there is less space required to form the field oxide isolation structure. Therefore there is more space remaining in the integrated circuit chip for the integrated circuit devices (e.g., transistors). This concept is usually expressed by stating that the abrupt bird's beak provides a better packing density for the integrated circuit devices. A major drawback of the abrupt bird's beak is that the abrupt bird's beak has a lower breakdown voltage.

Conversely, a major advantage of the graded bird's beak is that it provides a higher breakdown voltage. But the graded bird's beak takes up more lateral space than an abrupt bird's beak. This means that the graded bird's beak has a correspondingly worse packing density in the integrated circuit chip for the integrated circuit devices (e.g., transistors).

In prior art manufacturing methods a single value of pad oxide thickness is used and a single value of silicon nitride thickness is used. This means that the designer of an integrated circuit is forced to make a tradeoff between the packing density and the breakdown voltage of the integrated circuit chip. If the packing density is optimized then the breakdown voltage is not optimized. Conversely, if the breakdown voltage is optimized then the packing density is not optimized.

There is a need in the art for an efficient method for manufacturing an integrated circuit that has two different field oxide profiles. In particular, there is a need in the art for a method that is capable of forming both a graded bird's beak profile and an abrupt bird's beak profile with the same field oxidation process.

The present invention provides an efficient method for creating different field oxide profiles in a local oxidation of silicon process (LOCOS process). The method comprises (1) forming a first portion of the field oxide with a first field oxide profile (e.g., an abrupt bird's beak profile) during a field oxide oxidation process, and (2) forming a second portion of the field oxide with a second field oxide profile (e.g., a graded bird's beak profile) during the same field oxide oxidation process.

As will be described more fully below, an advantageous embodiment of the method of the invention uses a first value of a pad oxide thickness and a first value of a silicon nitride thickness to form a first portion of a field oxide having a first field oxide profile. The method simultaneously uses a second value of a pad oxide thickness and a second value of a silicon nitride thickness to form a second portion of the field oxide having a second field oxide profile.

It is an object of the present invention to provide a method for efficiently forming two different field oxide profiles during a field oxide oxidation process.

It is an object of the present invention to provide a manufacturing method for an integrated circuit that gives an integrated circuit designer the flexibility to create an appropriate type of field oxide profile in a desired location.

It is another object of the present invention to provide a manufacturing method for an integrated circuit that creates a graded bird's beak profile in an area where it is more important to have a higher breakdown voltage than a high packing density.

It is another object of the present invention to provide a manufacturing method for an integrated circuit that creates an abrupt bird's beak profile in an area where it is more important to have a higher packing density than a high breakdown voltage.

The foregoing has outlined rather broadly the features and technical advantages of the present invention so that those persons who are skilled in the art may better understand the detailed description of the invention that follows. Additional features and advantages of the invention will be described hereinafter that form the subject of the claims of the invention. Persons who are skilled in the art should appreciate that they may readily use the conception and the specific embodiment disclosed as a basis for modifying or designing other structures for carrying out the same purposes of the present invention. Persons who are skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those persons of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 5 through 12, discussed below, and the various embodiments used to describe the principles of the present invention in this patent document are by way of illustration only and should not be construed in any way to limit the scope of the invention. Persons who are skilled in the art will understand that the principles of the present invention may be implemented in any type of suitably arranged semiconductor device.

Figure 1:
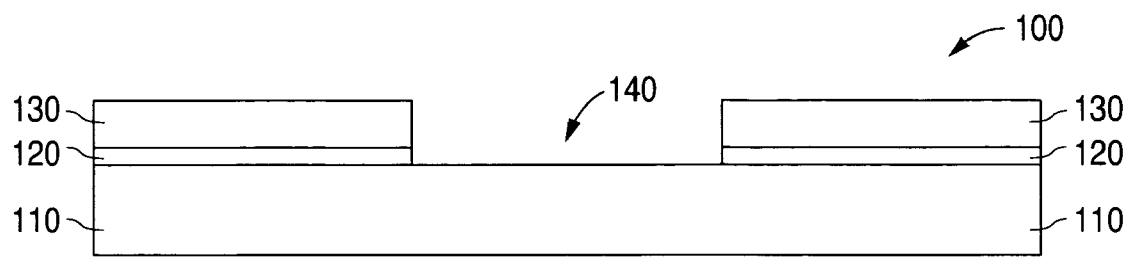
FIG. 1 illustrates an exemplary prior art structure for illustrating a local oxidation of silicon (LOCOS) process.
Figure 2:
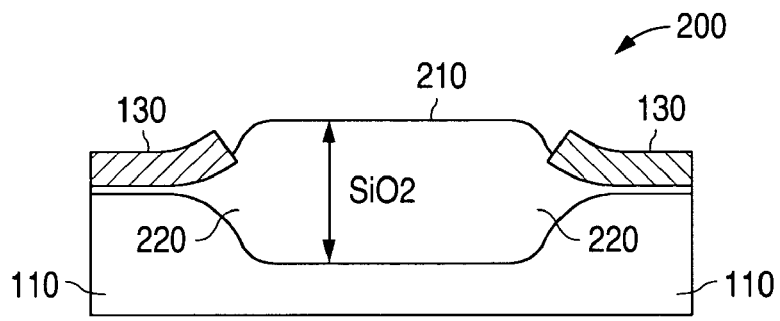
FIG. 2 illustrates an exemplary prior art structure that results from applying a LOCOS process to the structure shown in FIG. 1.
Figure 3:
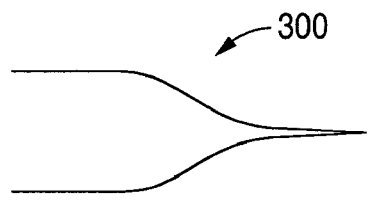
FIG. 3 illustrates an exemplary profile of a prior art graded bird's beak.
Figure 4:
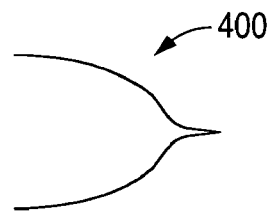
FIG. 4 illustrates an exemplary profile of a prior art abrupt bird's beak.
Figure 5:
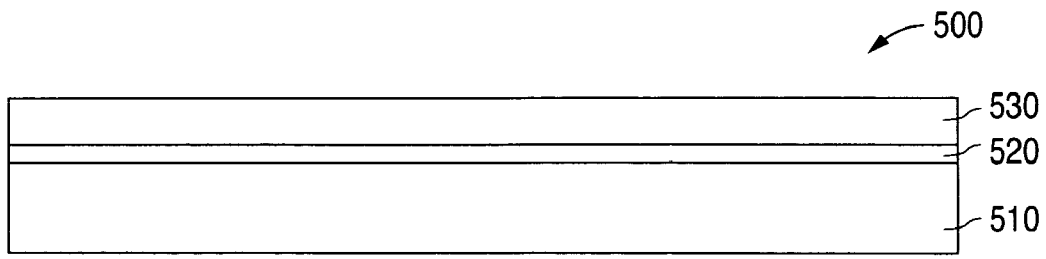
FIGS. 5 through 11 illustrate successive stages of a manufacturing method of the present invention for manufacturing different field oxide profiles in a local oxidation of silicon (LOCOS) process.

FIG. 5 illustrates a first stage of a manufacturing method of the present invention for manufacturing different field oxide profiles in a local oxidation of silicon (LOCOS) process. The structure 500 shown in FIG. 5 comprises a layer of silicon substrate 510. A layer of pad oxide 520 made up of silicon dioxide ($SiO_2$) is placed on the silicon substrate 510. In one advantageous embodiment of the method of the present invention the thickness of the pad oxide 520 is approximately two hundred fifty Ångstroms (250 Å). An Ångstrom is $10^{-10}$ meter.

Then a first layer 530 of silicon nitride ($Si_3N_4$) is placed on the layer pad oxide 520. In one advantageous embodiment of the method of the present invention the thickness of the first layer of silicon nitride 530 is approximately one thousand Ångstroms (1000 Å).

Figure 6:
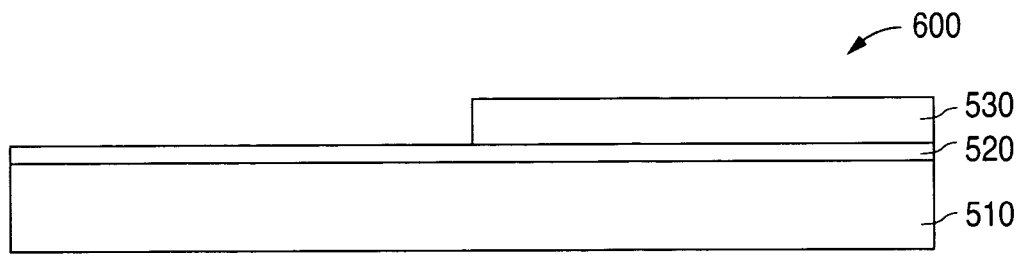

A mask and etch procedure is used to etch the first layer of silicon nitride 530 away from the areas of the integrated circuit chip that will require a high breakdown voltage. The portions of the first layer of silicon nitride 530 over the areas of the integrated circuit chip that will require a high packing density are left in place. The resulting structure 600 is shown in FIG. 6.

In the next step of the method of the present invention an additional pad oxide layer 710 is grown over the exposed portions of the original pad oxide layer 520. In one advantageous embodiment of the method of the present invention the additional pad oxide layer 710 increases the total thickness of the pad oxide layer over the areas of the integrated circuit chip that will require a high breakdown voltage to approximately six hundred thirty Ångstroms (630 Å). The resulting structure 700 is shown in FIG. 7.

Figure 7:
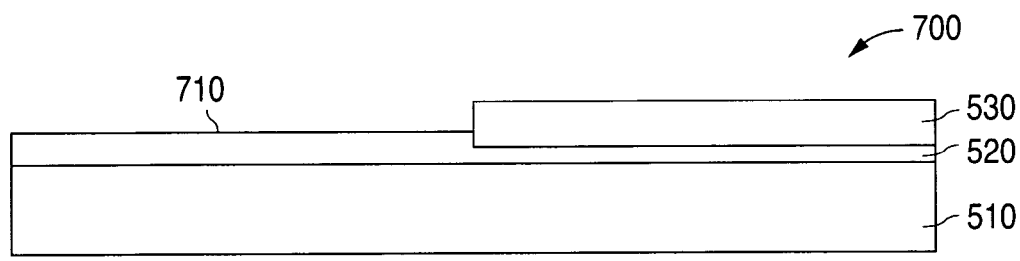

In the advantageous embodiment of the method of the present invention shown in FIG. 7 the thick pad oxide layer 710 (having a thickness of approximately 630 Å) is approximately three hundred eighty Ångstroms (380 Å) thicker than the thin pad oxide layer 520 (having a thickness of approximately 250 Å).

Figure 8:
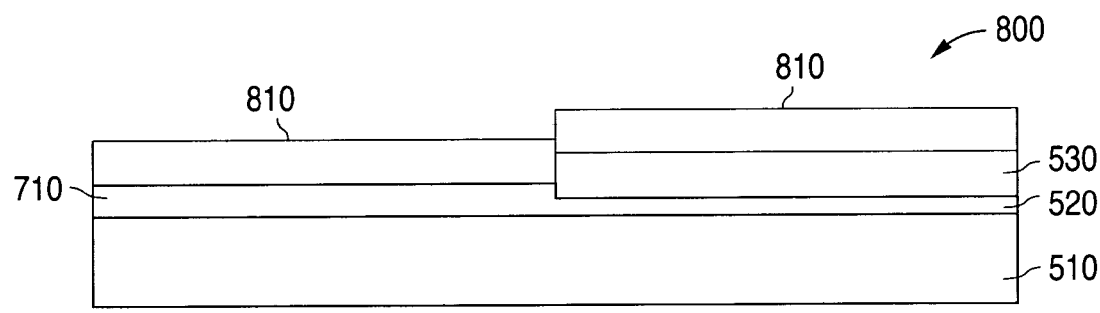

In the next step of the method of the present invention a second layer of silicon nitride 810 is deposited over the first layer of silicon nitride 530 and over the pad oxide layer 720. In one advantageous embodiment of the method of the present invention the thickness of the second layer of silicon nitride 810 is approximately one thousand Ångstroms (1000 Å). The resulting structure 800 is shown in FIG. 8.

Figure 9:
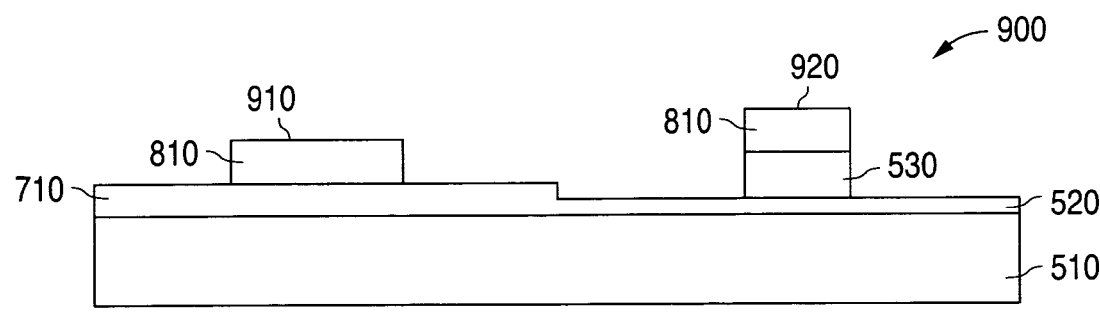

In the next step of the method of the present invention a mask and etch procedure is used pattern the second layer of silicon nitride 810 and the underlying first layer of silicon nitride 530. On the portion of the integrated circuit chip that will require a high breakdown voltage the etch procedure stops on the underlying pad oxide layer 720. On the portion of the integrated circuit chip that will require a high packing density the etch procedure stops of the underlying pad oxide 520. The resulting structure 900 is shown in FIG. 9.

For convenience of description the portion of the second layer of silicon nitride 810 that remains on the portion of the integrated circuit that will require a high breakdown voltage is designated with reference numeral 910. Similarly, the portion of the second layer of silicon nitride 810 that remains on the portion of the integrated circuit that will require a high packing density is designated with reference numeral 920. As shown in FIG. 9, the lateral dimension (or width) of the silicon nitride portion 910 is greater than the lateral dimension (or width) of the silicon nitride portion 920.

In the next step of the method of the present invention a field oxide is grown on the structure 900 by subjecting the structure 900 to steam ($H_2$, $O_2$) at a relatively high temperature (e.g., one thousand degrees Celsius (1000° C.)). The oxygen in the steam oxidizes the portions of the silicon substrate 510 that underlie the exposed portions of pad oxide layer 720 to form silicon dioxide ($SiO_2$). The oxygen in the steam also oxidizes the portions of the silicon substrate 510 that underlie the exposed portions of pad oxide layer 520 to form silicon dioxide ($SiO_2$).

Figure 10:
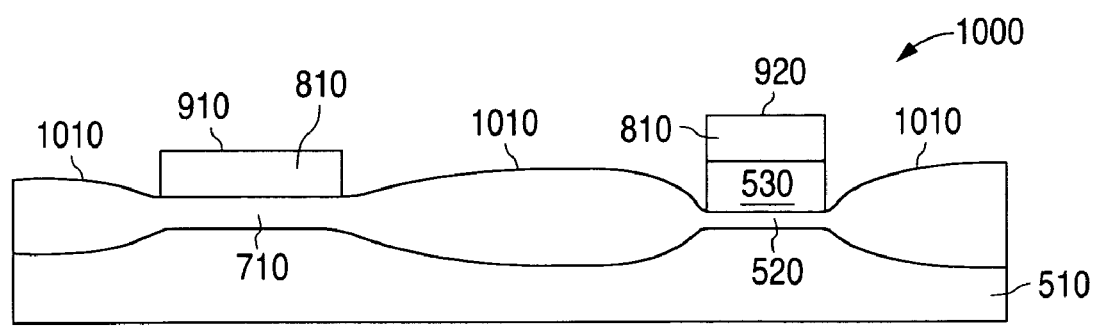

The oxidation process causes the oxidized portions of the silicon substrate 510 increase in size. The resulting structure 1000 is shown in FIG. 10. The field oxide portions are designated with reference numeral 1010.

During the oxidation process in the area with the thick pad oxide 710 and the single silicon nitride layer 910 the bird's beak profile of the field oxide 1010 will have a gradeder and more gradual profile. During the oxidation process in the area with the thin pad oxide 520 and the double nitride layers (i.e., silicon nitride layer 920 and silicon nitride layer 530) the bird's beak profile of the field oxide 1010 will have a shorter and more abrupt profile.

Figure 11:
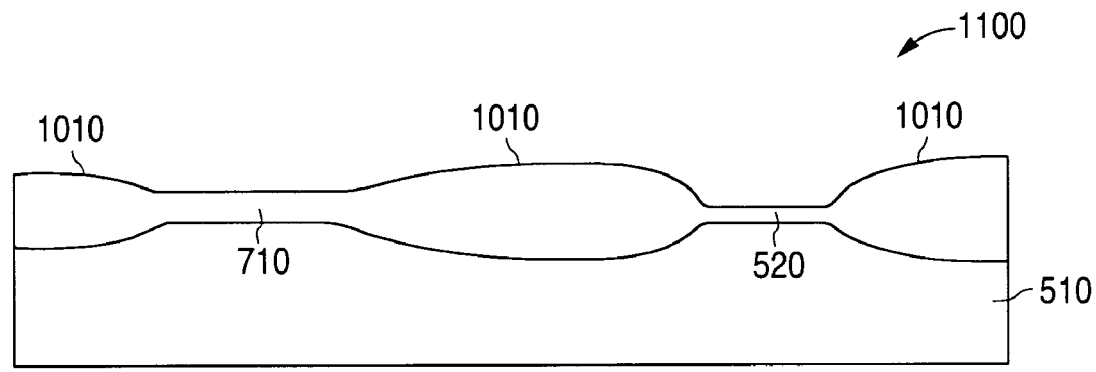

In the next step of the method of the present invention the silicon nitride layers are removed. Specifically, the silicon nitride layer 910 is removed from the portion of the integrated circuit that will require a high breakdown voltage. The silicon nitride layer 920 and the silicon nitride layer 530 are removed from the portion of the integrated circuit that will require a high packing density. The resulting structure 1100 is shown in FIG. 11.

In the last step of the method of the present invention the pad oxide layers are removed. Specifically, the thick pad oxide layer 710 and the thin pad oxide layer 520 are stripped away. The resulting structure 1200 is shown in FIG. 12.

Figure 12:
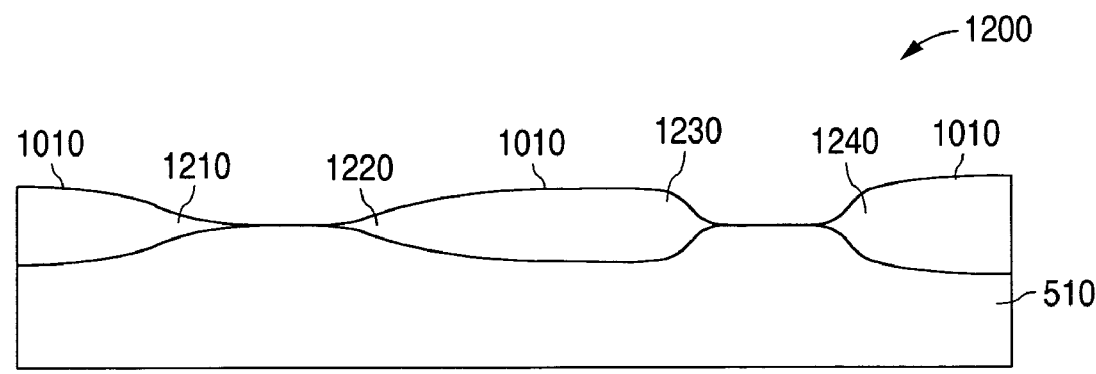
FIG. 12 illustrates two graded bird's beak profiles and two abrupt bird's beak profiles manufactured using the method of the present invention.

As shown in FIG. 12, the edge portions of the field oxide 1010 in the portions of the integrated circuit that will require a high breakdown voltage comprise a first graded bird's beak 1210 and a second graded bird's beak 1220. The edge portions of the field oxide 1010 in the portions of the integrated circuit that will require a high packing density comprise a first abrupt bird's beak 1230 and a second abrupt bird's beak 1240.

The first graded bird's beak 1210 and the second graded bird's beak 1220 have a higher breakdown voltage (which is more desirable) and a lower packing density (which is less desirable). The first abrupt bird's beak 1230 and the second abrupt bird's beak 1240 have a lower breakdown voltage (which is less desirable) and a higher packing density (which is more desirable).

The method of the present invention provides a novel and efficient method for forming two different field oxide profiles during a field oxide oxidation process. The method of the present invention gives an integrated circuit designer the flexibility to create an appropriate field oxide profile where desired. Specifically, the designer can create graded bird's beak profiles in those areas where it is more important to have a higher breakdown voltage than a high packing density. Similarly, the designer can create abrupt bird's beak profiles in those areas where it is more important to have a high packing density than a high breakdown voltage.

The method of the present invention creates integrated circuit chips that comprise (1) field oxide portions that facilitate the creation of integrated circuit devices that have a high packing density, and that comprise (2) field oxide portions that facilitate the creation of integrated circuit devices that have a high breakdown voltage.

The present invention has been described using basic LOCOS processing for both the thin and thick pad oxides and nitrides. It is understood that many presently existing modified LOCOS techniques could be applied to either or both of the oxide nitride stacks. Such modified LOCOS techniques include (but are not limited to) Poly Buffered LOCOS, recessed LOCOS, semi-recessed LOCOS, Poly Encapsulated LOCOS, and Side Wall Mask Isolation (SWAMI).

Although the present invention has been described with an exemplary embodiment, various changes and modifications may be suggested to one skilled in the art. It is intended that the present invention encompass such changes and modifications as fall within the scope of the appended claims.

What is claimed is:

1. A method for manufacturing a field oxide in an integrated circuit, the method comprising the step of:
    forming (i) a first portion of the field oxide with a first field oxide profile and (ii) a second portion of the field oxide with a second field oxide profile during a field oxide oxidation process;
    wherein forming the first and second portions of the field oxide comprises:
        forming a pad oxide layer over a silicon substrate;
        forming additional pad oxide over a portion of the pad oxide layer where the second portion of the field oxide is being formed;
        forming a layer of silicon nitride over the pad oxide layer and over the additional pad oxide;
        applying a mask and etch procedure to the silicon nitride layer to form a silicon nitride mask over the pad oxide layer and over the additional pad oxide;
        exposing portions of the pad oxide layer to the oxidation process to create the first portion of the field oxide; and
        exposing portions of the additional pad oxide to the oxidation process to create the second portion of the field oxide;
    wherein the first field oxide profile comprises an abrupt bird's beak profile; and
    wherein the second field oxide profile comprises a graded bird's beak profile.

2. The method as set forth in claim 1, further comprising the steps of:
    removing the silicon nitride layer that forms the silicon nitride mask from the pad oxide layer and from the additional pad oxide; and
    removing the pad oxide layer and the additional pad oxide.

3. The method of claim 1, wherein the abrupt bird's beak profile tapers to a point in a shorter distance than the graded bird's beak profile.

4. A method for manufacturing a field oxide in an integrated circuit, the method comprising the step of:
    forming (i) a first portion of the field oxide with a first field oxide profile and (ii) a second portion of the field oxide with a second field oxide profile during a field oxide oxidation process, the second field oxide profile different from the first field oxide profile;
    wherein forming the first and second portions of the field oxide comprises:

forming a pad oxide layer over a silicon substrate;
forming additional pad oxide over a portion of the pad oxide layer where the second portion of the field oxide is being formed;
forming a layer of silicon nitride over the pad oxide layer and over the additional pad oxide;
applying a mask and etch procedure to the silicon nitride layer to form a silicon nitride mask over the pad oxide layer and over the additional pad oxide;
exposing portions of the pad oxide layer to the oxidation process to create the first portion of the field oxide; and
exposing portions of the additional pad oxide to the oxidation process to create the second portion of the field oxide;
wherein the first field oxide profile comprises an abrupt bird's beak profile;
wherein the second field oxide profile comprises a graded bird's beak profile;
wherein a thickness of the pad oxide layer is approximately two hundred fifty Ångstroms; and
wherein a thickness of the silicon nitride layer is approximately one thousand Ångstroms.

5. A method for manufacturing a field oxide in an integrated circuit, the method comprising the steps of:
forming a first portion of the field oxide with a first field oxide profile during a field oxide oxidation process; and
forming a second portion of the field oxide with a second field oxide profile during the field oxide oxidation process, the second field oxide profile different from the first field oxide profile;
wherein forming the first and second portions of the field oxide comprises:
forming a pad oxide layer over a silicon substrate;
forming additional pad oxide over a portion of the pad oxide layer where the second portion of the field oxide is being formed;
forming a layer of silicon nitride over the pad oxide layer and over the additional pad oxide;
applying a mask and etch procedure to the silicon nitride layer to form a silicon nitride mask over the pad oxide layer and over the additional pad oxide;
exposing portions of the pad oxide layer to the oxidation process to create the first portion of the field oxide; and
exposing portions of the additional pad oxide to the oxidation process to create the second portion of the field oxide;
wherein the second portion of the field oxide is formed with a graded bird's beak profile.

6. The method as set forth in claim 5, wherein:
a thickness of the pad oxide layer is approximately two hundred fifty Ångstroms; and
a thickness of the silicon nitride layer is approximately one thousand Ångstroms.

7. The method as set forth in claim 5, further comprising the steps of:
removing the silicon nitride layer that forms the silicon nitride mask from the pad oxide layer and from the additional pad oxide; and
removing the pad oxide layer and the additional pad oxide.

8. A method for manufacturing a field oxide in an integrated circuit, the method comprising the steps of:
forming a first portion of the field oxide with an abrupt bird's beak field oxide profile during a field oxide oxidation process; and forming a second portion of the field oxide with a graded bird's beak field oxide profile during the field oxide oxidation process;
wherein forming the first and second portions of the field oxide comprises:
forming a first pad oxide layer over a silicon substrate;
forming a first layer of silicon nitride over the first pad oxide layer;
applying a mask and etch procedure to the first layer of silicon nitride to remove portions of the first layer of silicon nitride from the first pad oxide layer where the graded bird's beak field oxide profile will be formed;
forming additional pad oxide over exposed portions of the first pad oxide layer to form a second pad oxide layer; and
forming a second layer of silicon nitride over the second pad oxide layer and over the first layer of silicon nitride.

9. The method as set forth in claim 8 wherein:
a thickness of the first pad oxide layer is approximately two hundred fifty Ångstroms;
a thickness of the second pad oxide layer is approximately six hundred thirty Ångstroms;
a thickness of the first silicon nitride layer is approximately one thousand Ångstroms; and
a thickness of the second silicon nitride layer is approximately one thousand Ångstroms.

10. The method as set forth in claim 8 wherein forming the first and second portions of the field oxide further comprises the steps of:
removing portions of the second layer of silicon nitride from the second pad oxide layer to form a first silicon nitride mask where the graded bird's beak field oxide profile will be formed; and
removing portions of the second layer and the first layer of silicon nitride from the first pad oxide layer to form a second silicon nitride mask where the abrupt bird's beak field oxide profile will be formed.

11. The method as set forth in claim 10 wherein forming the first and second portions of the field oxide further comprises the steps of:
exposing portions of the second pad oxide layer and the silicon substrate under the exposed portions of the second pad oxide layer to the oxidation process to create the second portion of the field oxide with the graded bird's beak field oxide profile; and
exposing portions of the first pad oxide layer and the silicon substrate under the exposed portions of the first pad oxide layer to the oxidation process to create the first portion of the field oxide with the abrupt bird's beak field oxide profile.

12. The method as set forth in claim 11 wherein forming the first and second portions of the field oxide further comprises the steps of:
removing the second silicon nitride layer that forms the first silicon nitride mask from the second pad oxide layer;
removing the first and second silicon nitride layers that form the second silicon nitride mask from the first pad oxide layer; and
removing the first and second pad oxide layers.

13. The method as set forth in claim 10, wherein:
removing portions of the second layer of silicon nitride from the second pad oxide layer to form the first silicon nitride mask comprises applying a mask and etch procedure; and removing portions of the second layer and the first layer of silicon nitride from the first pad oxide layer to form the second silicon nitride mask comprises applying the mask and etch procedure.

14. The method of claim 8, wherein the abrupt bird's beak profile tapers to a point in a shorter distance than the graded bird's beak profile.

15. A method for manufacturing a field oxide in an integrated circuit, the method comprising:
    forming (i) a first portion of the field oxide with a first field oxide profile and (ii) a second portion of the field oxide with a second field oxide profile during a field oxide oxidation process;
    wherein forming the first and second portions of the field oxide comprises:
        forming pad oxide over a substrate;
        forming additional pad oxide over a portion of the pad oxide where the second portion of the field oxide is being formed;
        forming a silicon nitride layer over the pad oxide and over the additional pad oxide;
        applying a mask and etch procedure to the silicon nitride layer to form a silicon nitride mask over the pad oxide and over the additional pad oxide;
        exposing portions of the pad oxide to the oxidation process to create the first portion of the field oxide; and
        exposing portions of the additional pad oxide to the oxidation process to create the second portion of the field oxide;
    wherein the first and second field oxide profiles are different.

16. The method of claim 15, wherein:
    the first field oxide profile comprises an abrupt bird's beak profile;
    the second field oxide profile comprises a graded bird's beak profile; and
    the abrupt bird's beak profile tapers to a point in a shorter distance than the graded bird's beak profile.

17. The method of claim 15, wherein a thickness of the pad oxide is approximately two hundred fifty Ångstroms.

18. The method of claim 15, wherein a thickness of the additional pad oxide is approximately six hundred thirty Ångstroms.

19. The method of claim 15, wherein a thickness of the silicon nitride layer is approximately one thousand Ångstroms.

20. The method of claim 15, wherein forming the additional pad oxide comprises:
    forming a second silicon nitride layer over the pad oxide;
    applying a second mask and etch procedure to the second silicon nitride layer to remove portions of the second silicon nitride layer from the pad oxide; and
    forming the additional pad oxide over exposed portions of the pad oxide.

* * * * *